(12) United States Patent
Hirata et al.

(10) Patent No.: US 7,518,144 B2
(45) Date of Patent: Apr. 14, 2009

(54) ELEMENT FOR SOLID-STATE IMAGING DEVICE

(75) Inventors: Tatsuya Hirata, Osaka (JP); Shouzi Tanaka, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/653,919

(22) Filed: Jan. 17, 2007

(65) Prior Publication Data

US 2007/0200148 A1 Aug. 30, 2007

(30) Foreign Application Priority Data

Feb. 24, 2006 (JP) .............................. 2006-048483

(51) Int. Cl.
*H01L 29/10* (2006.01)
(52) U.S. Cl. ........................................ 257/59; 257/325
(58) Field of Classification Search .................. 257/59, 257/325
See application file for complete search history.

(56) References Cited

U.S. PATENT DOCUMENTS 6,406,975 B1 * 6/2002 Lim et al. .................... 438/421

FOREIGN PATENT DOCUMENTS

| JP | 2000-150847 | 5/2000 |
|---|---|---|
| JP | 2004-253729 | 9/2004 |

* cited by examiner

*Primary Examiner*—Douglas M Menz
(74) *Attorney, Agent, or Firm*—McDermott Will & Emery LLP

(57) ABSTRACT

In an element for a MOS type solid-state imaging device, a leakage current caused by a stress generated in a vicinity of an element isolation region having an STI structure is reduced. The element for the MOS type solid-state imaging device comprises: a signal accumulation region 102, of a second conductivity type, provided in an interior of a semiconductor substrate or well 101 of a first conductivity type, for accumulating a signal charge generated by performing photoelectric convention; a gate electrode 104 provided on the semiconductor substrate or well 101; a drain region 105, of a second conductivity type, provided on a surface portion, of the semiconductor substrate or well 101, on which the gate electrode is formed; and an element isolation region 201 provided on the surface portion, of the semiconductor substrate or well 101, on which the gate electrode is formed. The element isolation region 201 has the STI structure, and a cavity 202 is formed in an interior of the element isolation region 201.

3 Claims, 5 Drawing Sheets

ELEMENT FOR SOLID-STATE IMAGING DEVICE

BACKGROUND OF THE INVENTION

1. Field of the Invention

The present invention relates to an element for a solid-state imaging device, and more particularly to a structure, of an element isolation region, which solves a problem of the element being micromachined.

2. Description of the Background Art

In recent years, in the field of a solid-state imaging device, various techniques related to a structure of an amplified MOS image sensor have been proposed. It is advantageous that the amplified MOS image sensor consumes less power than a CCD image sensor. Furthermore, in the amplified MOS image sensor, it is also advantageous that a CMOS process is used for mounting both a sensor portion and a peripheral circuit thereof, thereby allowing the sensor portion and the peripheral circuit thereof to be easily integrated with each other.

Referring to FIGS. 4 and 5, an element for a solid-state imaging device, according to the conventional art, disclosed in Japanese Laid-Open Patent Publication No. 2000-150847 will be described. FIG. 4 is a plan view illustrating the element for the solid-state imaging device according to the conventional art. FIG. 4 shows a photoelectric conversion region and a signal read region, both of which are included in a pixel. FIG. 5 is a cross-sectional view illustrating the element for the solid-state imaging device along lines Y1-Y2 of FIG. 4.

As shown in FIG. 4, in the pixel, a signal accumulation region (photodiode) 102, a gate electrode 104 and a drain region 105 constitute a MOS transistor.

Furthermore, as shown in FIG. 5, the gate electrode 104 is provided on the P type well 101 with a gate oxide film 103 interposed therebetween. The drain region 105, made of an N type diffusion layer, is formed on a surface portion, of the P type well 101, on which the gate electrode 104 is formed. The signal accumulation region 102, made of the N type diffusion layer for converting light into electric charge and accumulating the converted electric charge, is formed in an interior of the P type well 101 which is formed in a semiconductor substrate (not shown) The drain region 105 is located on a side, of the gate electrode 104, opposite to that on which the signal accumulation region 102 is located.

A surface shield layer 106 is formed on the surface portion of the P type well 101. The surface shield layer 106 is located, such that at least a portion of the surface shield layer 106 is faced to the signal accumulation region 102 with the P type well 101 therebetween. The surface shield layer 106 is made of a P type diffusion layer.

An element isolation region 107 is provided on the surface portion of the P type well 101. The element isolation region 107 has an STI (shallow Trench Isolation) structure. The element isolation region 107 is operable to insulate the pixel from an adjacent pixel. Such an STI structure is formed by etching the P type well 101 to form a groove (trench), and then filling the groove with a silicon oxide 108.

In the element for the MOS type solid-state imaging device using the STI structure mentioned above, it is known that a crystal defect is generated in a vicinity of an interface between the element isolation region 107 and a peripheral portion thereof. Further, it is also known that when the element for the solid-state imaging device is thermally treated, a stress generated in the vicinity of the interface between the element isolation region 107 and the peripheral portion thereof is the largest among stresses generated in other areas of the element. Such a stress is caused by a difference between a thermal expansion coefficient of a material included in the element isolation region 107 (e.g., silicon oxide) and a thermal expansion coefficient of the P type well 101. Due to the crystal defect and the stress mentioned above, a leakage current flows from the element isolation region 107 into the signal accumulation region 102. When the leakage current flows into the signal accumulation region 102, a charge derived from the leakage current is added to a signal charge accumulated in the signal accumulation region 102, thereby causing white blemishes and minute unevenness to be generated on a screen when reproducing an image.

Nowadays, among the white blemishes and minute unevenness mentioned above, the white blemishes and minute unevenness caused by the crystal defect can be eliminated, by using an image correction technique developed along with the recent advancements in digital techniques, because the number of the white blemishes and minute unevenness caused by the crystal defect is relatively small. However, the stress is generated in almost all pixels. In other words, the stress is generated throughout an entirety of the screen. Thus, in order to eliminate, by using the image correction technique, the blemishes and minute unevenness caused by the stress, a memory having a large capacity is needed. As a result, it becomes difficult to miniaturize the imaging device, and to reduce electrical power consumed thereby, etc. Furthermore, steps and time required for fabricating the memory are caused to be increased, thereby resulting in an increased fabrication cost.

In order to solve the problems mentioned above, Japanese Laid-Open Patent Publication No. 2004-253729 proposes a technique, as shown in FIG. 6, in which a defect suppression layer 109, made of the P type diffusion layer, is provided along an entire exterior surface of the element isolation region 107. The defect suppression layer 109 is filled with a P type hole. By forming the defect suppression layer 109, it becomes possible to reduce the leakage current and a noise.

Furthermore, Japanese Laid-Open Patent Publication No. 2004-253729 discloses, as shown in FIG. 7, steps for forming the defect suppression layer 109. FIG. 7 is a schematic cross-sectional view illustrating steps, for implanting ions, performed when the defect suppression layer 109 is formed. As shown in FIG. 7, the P type well 101 is etched to form a groove (trench) 110. Thereafter, ions are implanted into an inner wall of the groove 110, thereby forming the defect suppression layer 109 along the entire exterior surface of the element isolation region 107. As shown by arrows in the FIG. 7, ions are implanted in diagonal directions with respect to the surface of the P type well 101.

However, the conventional art disclosed in Japanese Laid-Open Patent Publication No. 2004-253729 has the following problems. Specifically, along with the miniaturization of the element, a width of the groove 110, from which the element isolation region 107 is to be made, accordingly becomes narrower. In such a case, when ions are implanted in the diagonal directions with respect to the surface of the P type well 101, as shown in FIG. 8, there may be a case where the ions cannot be implanted directly into a surface of a deep portion of the groove 110. Therefore, the element for the solid-state imaging device, according to the conventional art, disclosed in Japanese Laid-Open Patent Publication No. 2004-253729, has a first problem in that there may be a case where the defect suppression layer 109 cannot be formed in an appropriate manner.

Furthermore, in the case where the defect suppression layer 109 is formed, as shown in FIG. 9, the defect suppression layer 109 causes a width of the signal accumulation region 102 to be reduced. Thus, a technique disclosed in Japanese Laid-Open Patent Publication No. 2004-253729 has a problem in that a capacity of the signal accumulation region 102 is caused be reduced when forming the defect suppression layer 109. Thus, a second problem of the element for the solid-state imaging device, according to the conventional art, is in that when a volume of the signal accumulation region 102 becomes reduced along with the miniaturization of the element, the capacity, of the signal accumulation region 102, which is reduced by forming the defect suppression layer 109, can be severe.

SUMMARY OF THE INVENTION

In order to solve the aforementioned first and second problems, an object of the present invention is to provide a high-performance element for a solid-state imaging device capable of reducing a leakage current caused by a stress generated by an element isolation region having the STI structure, and capable of minimizing a capacity reduction of a signal accumulation region, and suppressing the reduction of the number of saturated electrons included therein.

An element for a solid-state imaging device comprising: a signal accumulation region, of a second conductivity type, provided in an interior of a semiconductor substrate of a first conductivity type or in an interior of a well of the first conductivity type, for accumulating a signal charge generated by performing photoelectric conversion; a gate electrode provided on the semiconductor substrate or the well; a drain region, of the second conductivity type, provided on a surface portion of the semiconductor substrate or a surface portion of the well; and an element isolation region formed on the surface portion of the semiconductor substrate or the surface portion of the well, wherein the element isolation region has an STI (Shallow Trench Isolation) structure, and a cavity is formed in an interior of the element isolation region.

According to the present invention, the cavity is formed in the interior of the element isolation region, whereby a difference between a distortion of a material buried in the interior of the element isolation region, and a distortion of the semiconductor substrate or the like, is mostly absorbed into the cavity. Therefore, the stress generated in the vicinity of an interface between the element isolation region having the STI structure and a peripheral portion thereof can be reduced, thereby making it possible to prevent a leakage current, caused by the stress, from being generated. Thus, it is no longer necessary to form the defect suppression layer for suppressing the leakage current. Therefore, even when the miniaturization of the element causes a width of the element isolation region to become narrower, and the defect suppression layer cannot be formed along an exterior surface of a lower portion of the element isolation region, the leakage current caused by the stress can be reduced. Furthermore, it is no longer necessary to form the defect suppression layer, thereby making it possible to suppress a capacity reduction of the signal accumulation region, and also to suppress the reduction of the number of saturated electrons included in the signal accumulation region.

Preferably, in the present invention, a width of the element isolation region is smaller than a depth of the element isolation region.

By having the aforementioned feature, a packing density of the element can be improved. The larger a depth of the element isolation region becomes, the more an element isolation function (i.e., insulation function) performed by the region is improved. Therefore, the width of the element isolation region is set to be smaller than the depth thereof, thereby making it possible to improve the element isolation function, to reduce the width of the element isolation region, and even to improve the packing density of the element itself.

Preferably, in the present invention, a surface shield layer is formed on the surface portion of the semiconductor substrate or the surface portion of the well, such that at least a portion of the surface shield layer is faced to the signal accumulation region, with the semiconductor substrate or the well which is situated between the surface shield layer and the signal accumulation region, and the surface shield layer is an impurity region, of the first conductivity type, having an impurity concentration higher than that, of the semiconductor substrate or the well, and the gate electrode is located, such that at least a portion of the gate electrode is faced to the signal accumulation region, with the semiconductor substrate or the well which is situated between the gate electrode and the signal accumulation region.

By having the aforementioned feature, there are advantageous effects in that white blemishes caused by an interface state can be reduced, and a signal is allowed to be more easily transferred from the signal accumulation region to the drain region.

As described above, according to the present invention, the cavity is formed in the interior of the element isolation region, whereby a difference between a distortion of a material buried in the interior of the element isolation region, and a distortion of the semiconductor substrate or the like, is mostly absorbed into the cavity. Therefore, the stress generated in the vicinity of an interface between the element isolation region having the STI structure and a peripheral portion thereof can be reduced, thereby making it possible prevent a leakage current, caused by the stress, from being generated. Thus, it is no longer necessary to form the defect suppression layer for suppressing the leakage current. Therefore, even when the miniaturization of the element causes a width of the element isolation region to become narrower, and the defect suppression layer cannot be formed along an exterior surface of a lower portion of the element isolation region, the leakage current caused by the stress can be reduced. Furthermore, it is no longer necessary to form the defect suppression layer, thereby making it possible to suppress a capacity reduction of the signal accumulation region, and also to suppress the reduction of the number of saturated electrons included in the signal accumulation region.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, an element for a solid-state imaging device according to an embodiment of the present invention will be described with reference to the drawings.

Note that claimed terms, a "first conductivity type" and a "second conductivity type" are used to indicate conductivity types. The "first conductivity type" and the "second conductivity type" are inverse to each other. Therefore, when the "first conductivity type" is P type, for example, the "second conductivity type" is N type. On the other hand, the "first conductivity type" is N type, for example, the second conductivity type" is P type. In the present invention, the "first conductivity type" and the "second conductivity type" indicate either N type and P type, or P type and N type, respectively. Hereinafter, in the present embodiment, a case where the "first conductivity type" is P type, and the second conductivity type" is N type will be described, as an example.

Furthermore, in the present invention, a signal accumulation region, a gate region and a drain region constitute a transistor (e.g., MOS transistor). These components forming the transistor may be provided directly in an interior of a conductivity type semiconductor substrate, or may be provided in an interior of a well formed in the interior of the conductivity type semiconductor substrate. Hereinafter, in the present embodiment, a case where the components forming the transistor are provided in the interior of the well formed in the interior of the conductivity type semiconductor substrate will be described, as an example. Note that a conductivity type of the semiconductor substrate is the same as that of the well.

Figure 1:
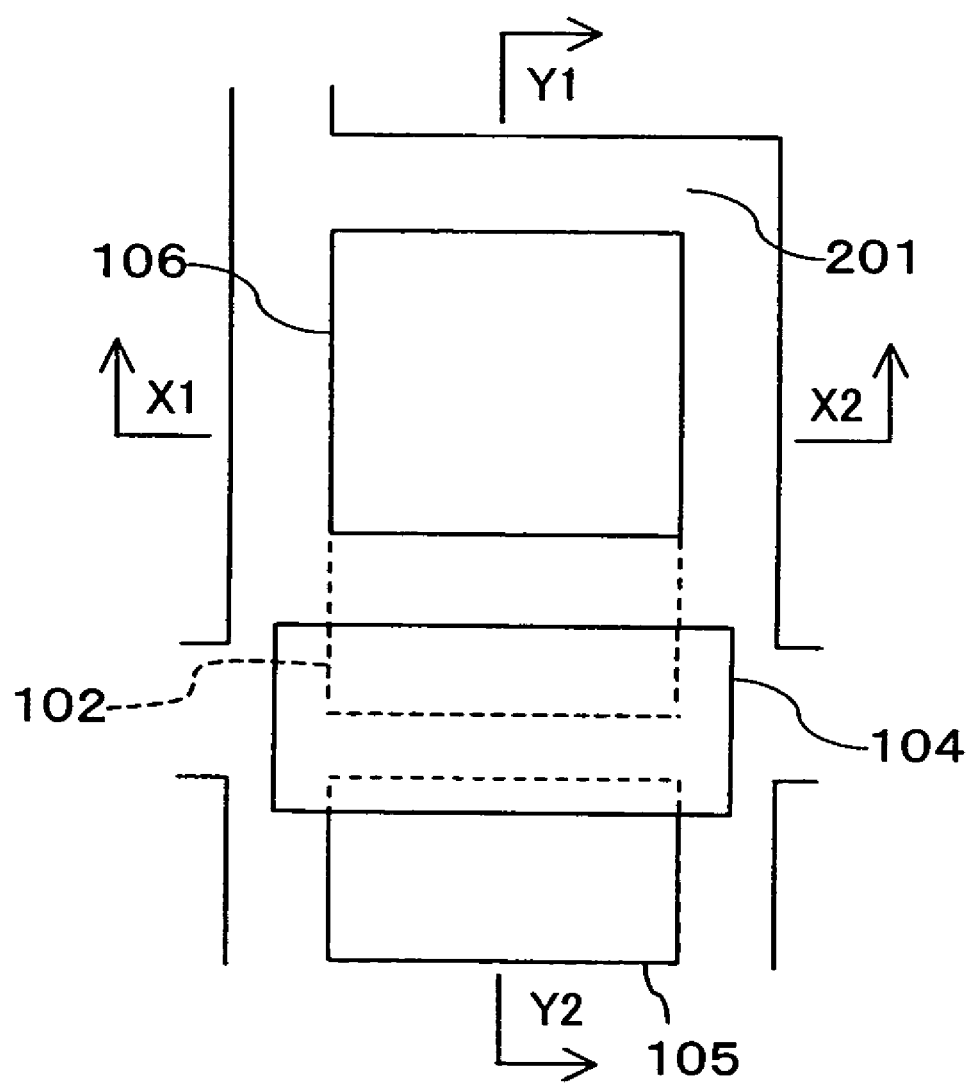
FIG. 1 is a plan view illustrating an embodiment of an element for a solid-state imaging device according to the present invention.
Figure 2:
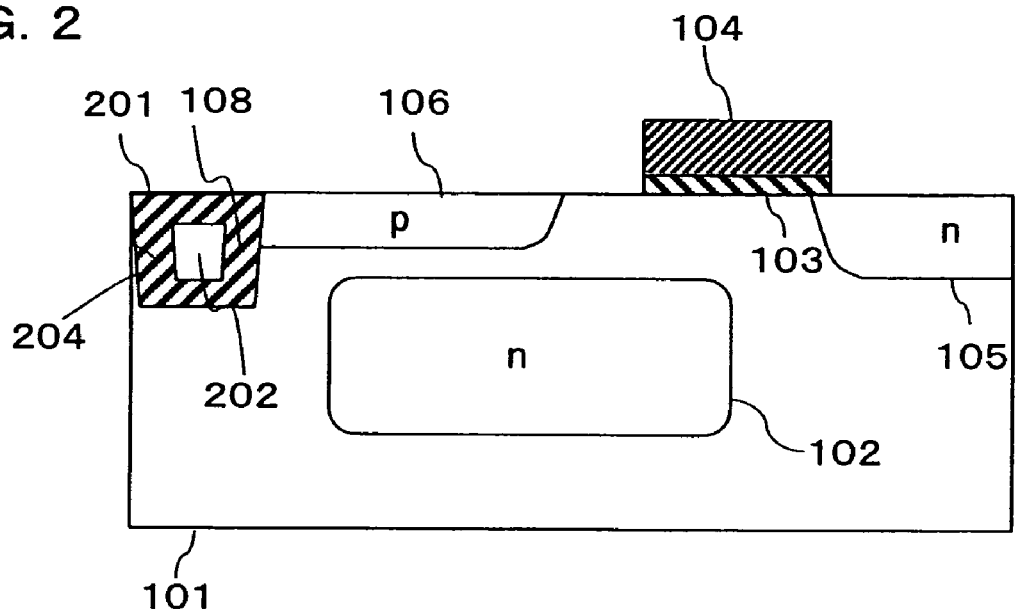
FIG. 2 is a cross-sectional view of the element for the solid-state imaging device along lines Y1-Y2 of FIG. 1.

FIG. 1 is a plan view of an element for a solid-state imaging device according to the embodiment of the present invention. FIG. 2 is a cross-sectional view illustrating the element for the solid-state imaging device along lines Y1-Y2 of FIG. 1. The element for the solid-state imaging device according to the present embodiment composes a pixel included in the solid-state imaging device. As shown in FIGS. 1 and 2, the element for the solid-state imaging device comprises a signal accumulation region 102, of the second conductivity type, formed in an interior of a well 101 of the first conductivity type, a gate electrode 104, a drain region 105 of the second conductivity type, and an element isolation region 201.

The signal accumulation region 102, made of an N type diffusion layer, converts light into charge, and accumulates the charge. The signal accumulation region 102 is formed in the interior of the P type well 101. The P type well 101 is made of a P type diffusion layer.

The gate electrode 104 is provided on the P type well 101. As an example shown in FIG. 2, the gate electrode 104 is located, such that at least a portion of the gate electrode 104 is faced to the signal accumulation region 102 with the P type well 101 therebetween. The gate electrode 104 is located on the P type well 101 with the gate oxide film 103 interposed therebetween.

The drain region 105 is made of the N type diffusion layer. The drain region 105 is formed on a surface portion of the P type well 101. Furthermore, the drain region 105 is located on a side, of the gate electrode 104, opposite to that on which the signal accumulation region 102 is located.

The surface shield layer 106 is formed on the surface portion of the P type well 101. The surface shield layer 106 is located, such that at least a portion of the surface shield layer 106 is faced to the signal accumulation region 102 with the P type well 101 therebetween.

The element isolation region 201 is formed in the surface portion of the P type well 101. The element isolation region 201 has an STI (Shallow Trench Isolation) structure. The element isolation region 201 is formed by etching the P type well 101 to form a groove (trench), and then filling the groove with the silicon oxide 108. A cavity 202 (air gap) is formed in an interior of the element isolation region 201.

Figure 8:
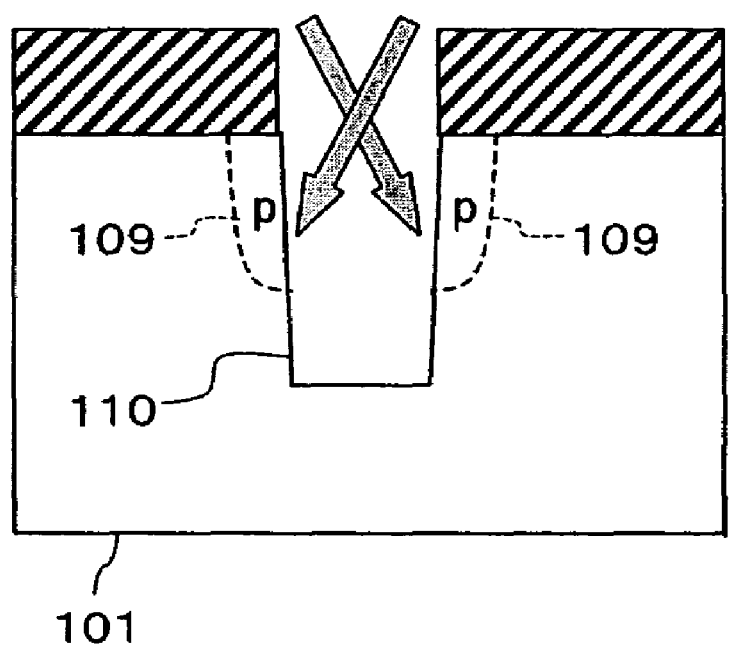
FIG. 8 is a schematic cross-sectional view showing the method for fabricating the element for the solid-state imaging device according to the conventional art, particularly, illustrating a case where the ion implantation for forming the defect suppression layer is difficult to perform.

By forming the cavity 202 in the interior of the element isolation region 201 having the STI structure, it becomes possible to reduce a stress generated by a difference between a thermal expansion coefficient of the P type well 101 and a thermal expansion coefficient of the silicon oxide 108. In other words, the cavity 202 is formed in the interior of the element isolation region 201, whereby a difference between a thermal distortion of the silicon oxide 108 buried in the interior of the element isolation region 201, and a thermal distortion of the P type well 101, is mostly absorbed into the cavity 202. Therefore, the stress generated in the vicinity of an interface between the element isolation region 201 and a peripheral portion thereof can be reduced, thereby making it possible to prevent a leakage current, caused by the stress, from being generated. It is particularly effective when a depth of the element isolation region becomes larger while a width thereof becomes smaller, along with the miniaturization of the element (see FIG. 8). This is because when ions are implanted, in a state where a width of the groove (trench) is small and a depth thereof is large, in the diagonal directions with respect to the surface of the well 101, it is difficult to implant the ions deeply into the groove, so as to form the defect suppression layer 109 along an exterior surface of a deep portion of the groove.

Figure 3:
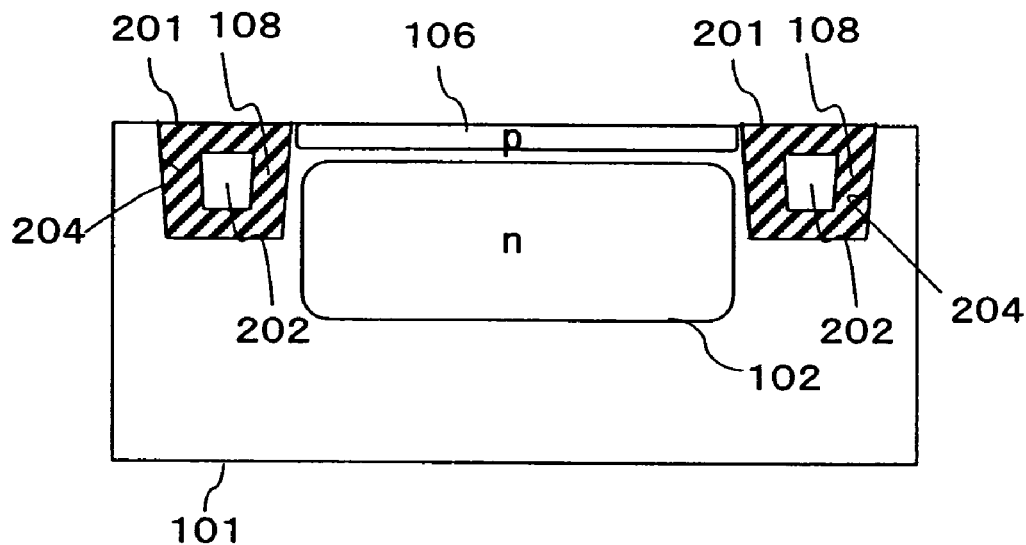
FIG. 3 is a cross-sectional view of the element for the solid-state imaging device along lines X1-X2 of FIG. 1.
Figure 4:
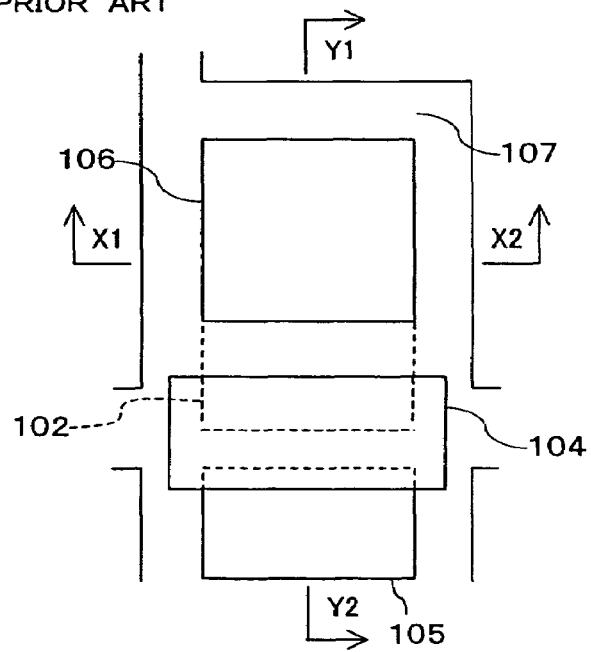
FIG. 4 is a plan view illustrating an element for a solid-state imaging device according to a conventional art.
Figure 5:
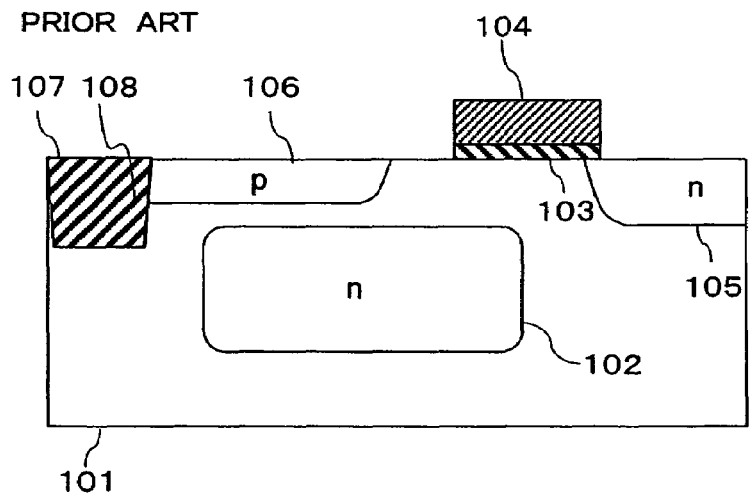
FIG. 5 is a cross-sectional view of the element for the solid-state imaging device along lines Y1-Y2 of FIG. 4.
Figure 6:
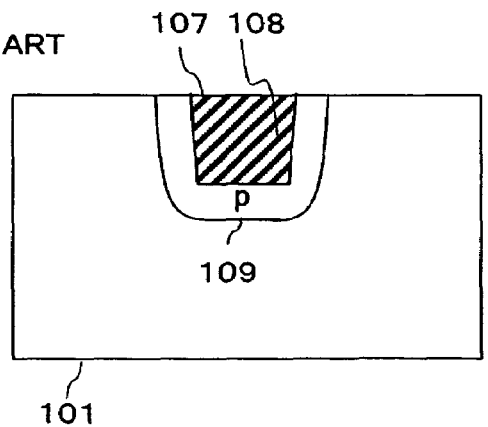
FIG. 6 is a cross-sectional view illustrating a vicinity of an element isolation region of the solid-state imaging device according to the conventional art.
Figure 7:
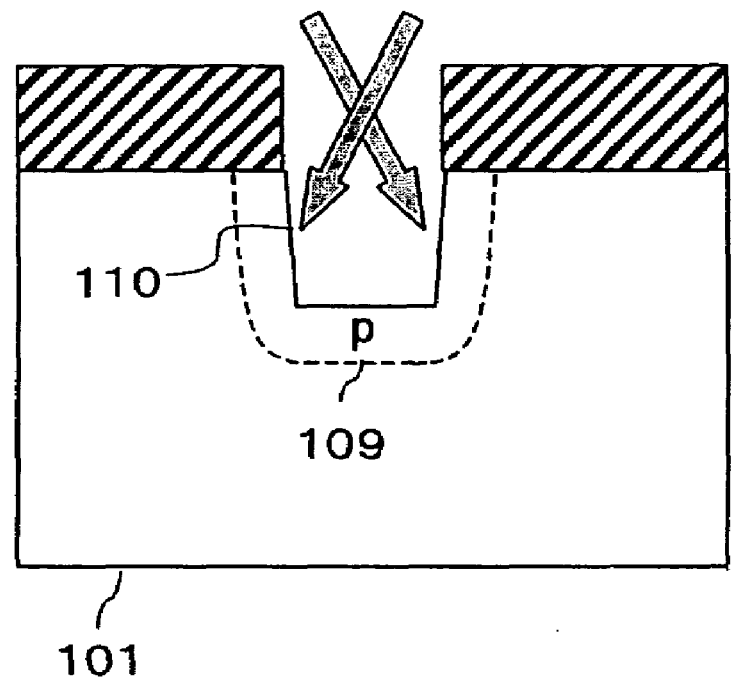
FIG. 7 is a schematic cross-sectional view showing a method for fabricating the element for the solid-state imaging device according to the conventional art, particularly, illustrating a step for performing an ion implantation in order to form a defect suppression layer.

FIG. 3 is a cross-sectional view illustrating the element for the solid-state imaging device along lines X1-X2 of FIG. 1 according to the present invention. Specifically, FIG. 3 shows a photoelectric conversion region and a signal read region, both of which are included in a pixel.

Figure 9:
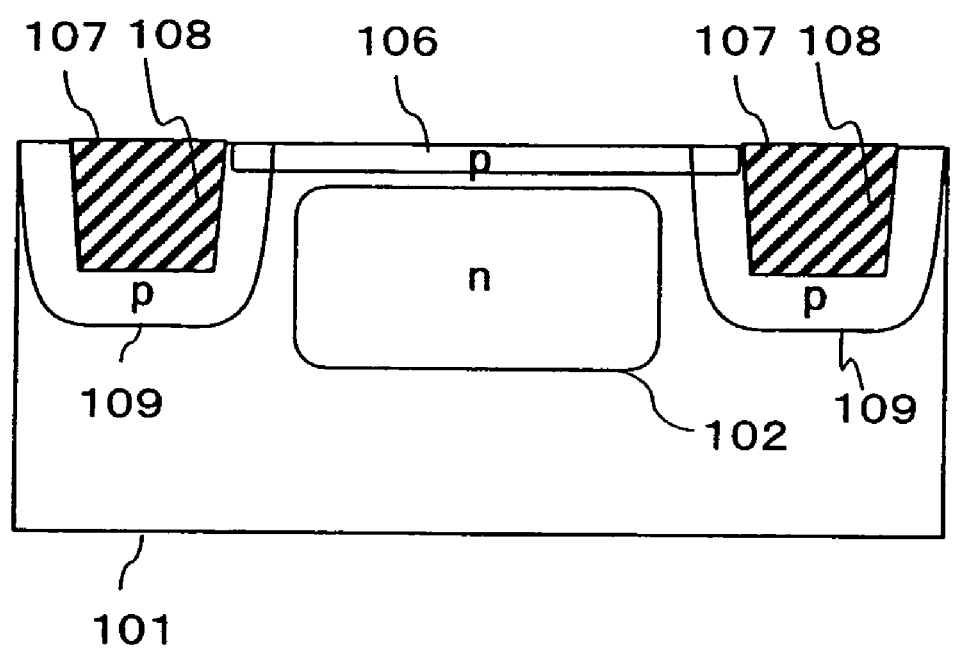
FIG. 9 is a cross-sectional view of the element for the solid-state imaging device according to the conventional art along lines X1-X2 of FIG. 4.

In order to compare with a structure shown in FIG. 3, a structure of an element for a solid-state imaging device according to the conventional art is shown in FIG. 9.

As shown in FIG. 3, the cavity (air gap) 202 is formed in the interior of the element isolation region 201, thereby making it possible to reduce the stress generated by the difference between the thermal expansion coefficient of the P type well 101 and the thermal expansion coefficient of the silicon oxide 108 in the above-described manner. Therefore, the defect suppression layer 109 (see FIG. 9) can be eliminated, or a thickness of the defect suppression layer 109 can be smaller than that of a conventional defect suppression layer. Thus, a depth of the element isolation region 201 can be larger. When the element isolation region 201 is formed to have a large depth, an element isolation function performed by the element isolation region 201 is to be improved.

Furthermore, the defect suppression layer 109 (see FIG. 9) is eliminated, or the depth of the defect suppression layer 109 is formed so as to be smaller than that of the conventional defect suppression layer, thereby allowing a volume of the signal accumulation region (photodiode) 102 (see FIG. 3) to be larger than that of the signal accumulation region (photodiode) 102 according to the conventional art (see FIG. 9). If the signal accumulation region 102 has a larger volume, a capacity (in Farads (F)) of the signal accumulation region 102 can be prevented from being reduced.

Still furthermore, in the present embodiment, because the cavity 202 is formed in the interior of the element isolation region 201, the stress generated by the difference between the thermal expansion coefficient of the well 101 and the thermal expansion coefficient of the silicon oxide 108 can be reduced, thereby making it possible to accordingly reduce the leakage current caused by the stress. Therefore, white blemishes and unevenness generated throughout an entirety of a screen when outputting an image can be suppressed.

Next, a method for fabricating the element for the solid-state imaging device according to the embodiment of the present invention will be described.

In the present invention, components other then the element isolation region 201 are fabricated in the same manner as the conventional art, and the descriptions thereof will be omitted. Hereinafter, a method for fabricating the element isolation region 201 will be mainly described.

Firstly, (a) a portion, of the P type well 101, in which element isolation is to be performed, is etched so as to form a groove (trench) 204. (b) A $SiO_2$ film is grown in the groove 204, thereby filling the groove 204 with the $SiO_2$ film. (c) Thereafter, a SiN film is formed on the $SiO_2$ film. (d) Then, a portion of the SiN film, which is immediately above a region where the cavity 202 is to be formed, is removed. (e) Next, the $SiO_2$ film is anisotropically etched using a remaining SiN film as a photoresist film. (f) Then, a $SiO_2$ film is grown again in a portion having been etched. If an aspect ratio of the groove 204 (depth of groove/width of groove) is previously set to be large, the cavity 202 can be formed in at least a lower portion of the groove 204, when the $SiO_2$ film is grown again in step (f). Note that an aspect ratio of the groove 204 is not particularly limited only if the ratio is in a range within which the cavity 202 can be formed. However, the aspect ratio of the groove 204 can be set in a range from 0.8 to 5.0, for example.

Although the above embodiment describes the method for fabricating the element for the solid-state imaging device, an embodiment of the present invention is not limited thereto. Only if the cavity 202 can be formed in the interior of the element isolation region 201, a detailed embodiment of the present invention is not particularly limited.

The present invention contributes to the miniaturization of an element for a solid-state imaging device, for example. Furthermore, the present invention also contributes to the high performance of various types of photographing devices each mounting the element, or a mobile apparatus having a photographing device such as a cellular phone having a camera.

While the invention has been described in detail, the foregoing description is in all aspects illustrative and not restrictive. It is understood that numerous other modifications and variations can be devised without departing from the scope of the invention.

What is claimed is:

1. An element for a solid-state imaging device comprising:
   a signal accumulation region, of a second conductivity type, provided in an interior of a semiconductor substrate of a first conductivity type or in an interior of a well of the first conductivity type, for accumulating a signal charge generated by performing photoelectric conversion;
   a gate electrode provided on the semiconductor substrate or the well;
   a drain region, of the second conductivity type, provided on a surface portion of the semiconductor substrate or a surface portion of the well; and
   an element isolation region formed on the surface portion of the semiconductor substrate or the surface portion of the well, wherein
   the element isolation region has an STI (Shallow Trench Isolation) structure, a cavity is formed in an interior of the element isolation region, and a thickness of a portion of the element isolation region above the cavity is substantially the same.

2. The element for the solid-state imaging device according to claim 1, wherein a width of the element isolation region is smaller than a depth of the element isolation region.

3. The element for the solid-state imaging device according to claim 1, wherein a surface shield layer is formed on the surface portion of the semiconductor substrate or the surface portion of the well, such that at least a portion of the surface shield layer is faced to the signal accumulation region, with the semiconductor substrate or the well which is situated between the surface shield layer and the signal accumulation region, and
   the surface shield layer is an impurity region, of the first conductivity type, having an impurity concentration higher than that of the semiconductor substrate or the well, and the gate electrode is located, such that at least a portion of the gate electrode is faced to the signal accumulation region, with the semiconductor substrate or the well which is situated between the gate electrode and the signal accumulation region.

* * * * *